United States Patent
Huang et al.

(10) Patent No.: US 11,258,007 B2
(45) Date of Patent: Feb. 22, 2022

(54) REVERSED STACK MTJ

(71) Applicant: Taiwan Semiconductor Manufacturing Co., Ltd., Hsin-Chu (TW)

(72) Inventors: Wei-Hang Huang, Kaohsiung (TW); Fu-Ting Sung, Yangmei (TW); Chern-Yow Hsu, Chu-Bei (TW); Shih-Chang Liu, Alian Township (TW); Chia-Shiung Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/065,606

(22) Filed: Oct. 8, 2020

(65) Prior Publication Data

US 2021/0043832 A1  Feb. 11, 2021

Related U.S. Application Data

(63) Continuation of application No. 16/683,568, filed on Nov. 14, 2019, now Pat. No. 10,840,438, which is a continuation of application No. 15/463,500, filed on Mar. 20, 2017, now Pat. No. 10,529,916, which is a continuation of application No. 14/918,671, filed on Oct. 21, 2015, now Pat. No. 9,614,145, which is a continuation of application No. 14/016,343, filed on Sep. 3, 2013, now Pat. No. 9,196,825.

(51) Int. Cl.
| | | |
|---|---|---|
| *H01L 43/08* | (2006.01) | |
| *H01L 43/12* | (2006.01) | |
| *H01L 43/02* | (2006.01) | |
| *H01L 43/10* | (2006.01) | |

(52) U.S. Cl.
CPC .............. *H01L 43/08* (2013.01); *H01L 43/02* (2013.01); *H01L 43/12* (2013.01); *H01L 43/10* (2013.01)

(58) Field of Classification Search
CPC ........................... H01L 27/222; H01L 27/224
See application file for complete search history.

(56) References Cited

U.S. PATENT DOCUMENTS

| | | |
|---|---|---|
| 7,199,985 B1 | 4/2007 | Sato et al. |
| 7,723,128 B2 | 5/2010 | Wang et al. |
| 7,939,188 B2 | 5/2011 | Xi et al. |
| 8,278,122 B2 | 10/2012 | Lu et al. |

(Continued)

OTHER PUBLICATIONS

Non-Final Office Action dated Jan. 15, 2015 for U.S. Appl. No. 14/016,343.

(Continued)

*Primary Examiner* — Elias Ullah
(74) *Attorney, Agent, or Firm* — Eschweiler & Potashnik, LLC

(57) ABSTRACT

An integrated circuit device includes a substrate and a magnetic tunneling junction (MTJ). The MTJ includes at least a pinned layer, a barrier layer, and a free layer. The MTJ is formed over a surface of the substrate. Of the pinned layer, the barrier layer, and the free layer, the free layer is formed first and is closest to the surface. This enables a spacer to be formed over a perimeter region of the free layer prior to etching the free layer. Any damage to the free layer that results from etching or other free layer edge-defining process is kept at a distance from the tunneling junction by the spacer.

20 Claims, 10 Drawing Sheets

(56) References Cited

U.S. PATENT DOCUMENTS

| | | |
|---|---|---|
| 8,416,600 B2 | 4/2013 | Lin et al. |
| 8,541,247 B2 | 9/2013 | Xi et al. |
| 8,796,042 B2 | 8/2014 | Shin et al. |
| 9,196,825 B2 | 11/2015 | Huang et al. |
| 9,368,716 B2 | 6/2016 | Gu et al. |
| 2003/0179510 A1 | 9/2003 | Hayakawa |
| 2004/0061983 A1 | 4/2004 | Childress et al. |
| 2008/0007991 A1 | 1/2008 | Diteweg et al. |
| 2009/0194833 A1 | 8/2009 | Wang et al. |
| 2011/0180888 A1 | 7/2011 | Xi et al. |
| 2012/0135543 A1 | 5/2012 | Shin et al. |
| 2012/0244639 A1 | 9/2012 | Ohsawa et al. |
| 2012/0315707 A1 | 12/2012 | Nam |
| 2013/0001652 A1 | 1/2013 | Koshikawa et al. |
| 2013/0175644 A1 | 7/2013 | Horng et al. |
| 2014/0042567 A1 | 2/2014 | Jung et al. |

OTHER PUBLICATIONS

Notice of Allowance dated Jul. 22, 2015 for U.S. Appl. No. 14/016,343.
Non-Final Office Action dated Jul. 15, 2016 for U.S. Appl. No. 14/918,671.
Notice of Allowance dated Nov. 21, 2016 for U.S. Appl. No. 14/918,671.
Non-Final Office Action dated Sep. 11, 2017 for U.S. Appl. No. 15/463,500.
Notice of Allowance dated Aug. 27, 2019 for U.S. Appl. No. 15/463,500.
Notice of Allowance dated Jul. 9, 2020 for U.S. Appl. No. 16/683,568.

REVERSED STACK MTJ

REFERENCE TO RELATED APPLICATIONS

This Application is a Continuation of U.S. application Ser. No. 16/683,568, filed on Nov. 14, 2019, which is a Continuation of U.S. application Ser. No. 15/463,500, filed on Mar. 20, 2017 (now U.S. Pat. No. 10,529,916, issued on Jan. 7, 2020), which is a Continuation of U.S. application Ser. No. 14/918,671, filed on Oct. 21, 2015 (now U.S. Pat. No. 9,614,145, issued on Apr. 4, 2017), which is a Continuation of U.S. application Ser. No. 14/016,343, filed on Sep. 3, 2013 (now U.S. Pat. No. 9,196,825, issued on Nov. 24, 2015). The contents of the above-referenced Patent Applications are hereby incorporated by reference in their entirety.

FIELD

The present disclosure relates to integrated circuit devices with magnetic tunneling junctions and methods for manufacturing them.

BACKGROUND

Magnetic media such as used in hard disk drives and magnetic tapes allow information to be stored for long periods of time. For traditional magnetic media, data access time is limited by mechanical systems. Dynamic Random Access Memory (DRAM) and Static Random Access Memory (SRAM) have data access times on the ns scale for both read and write operations. These memories types are volatile: data is stored only as long as power is supplied to refresh the capacitor charge in DRAM and to keep the transistors on in SRAM. The need for non-volatile memory is reflected by the increasing demand for Flash memory. Flash technology has comparatively slow access times (in the µs range) and can be rewritten only a limited number of times. For these reasons, there has been keen interest in commercializing magnetoresistive random access memory (MRAM), which provides non-volatile storage and read and write speeds similar to DRAM and SRAM.

An MRAM cell is formed by a magnetic tunneling junction (MTJ), which is a structure in which two ferromagnetic layers are separated by a thin insulating barrier. When a potential difference is applied across the two ferromagnetic layers, current flows through the insulating barrier by quantum mechanical tunneling. The resistance of the MTJ depends on the relative orientation of magnetic elements in the two ferromagnetic layers. The resistance is lowest when the magnetizations are aligned in parallel and highest when they are anti-parallel. One of the relative orientations can be used to represent a "1" and the other to represent a "0". In general, the magnetic orientation of one of the layers (the pinned layer) is kept fixed while the magnetic orientation of the other layer (the free layer) is set in a write operation. The state of the MRAM cell can be queried by measuring the junction's resistance. For an array of MRAM cells to provide reliable data storage, a sufficiently great difference in resistance between the two possible states must be realized for each cell in the array.

DETAILED DESCRIPTION

The inventors realized that defects in MRAM cells can be caused by conventional manufacturing processes. In particular, the free layer has been found to be susceptible to plasma damage and contamination by metal ions during etching. The inventors solved this problem by reversing the usual order of the film stack to place the free layer on the bottom. This facilitates etching the free layer separately from the other layers and forming a protective sidewall barrier for the free layer before etching any other layers.

The reverse layer order in the MTJ stack further allows a spacer to be formed over a perimeter region of the free layer prior to etching the free layer. The spacer is a sidewall barrier for the pinned layer and other layers of the MTJ stack. The spacer keeps any damage to the free layer that results from etching or other free layer edge-defining process at a distance from the magnetic tunneling junction.

Figure 1:
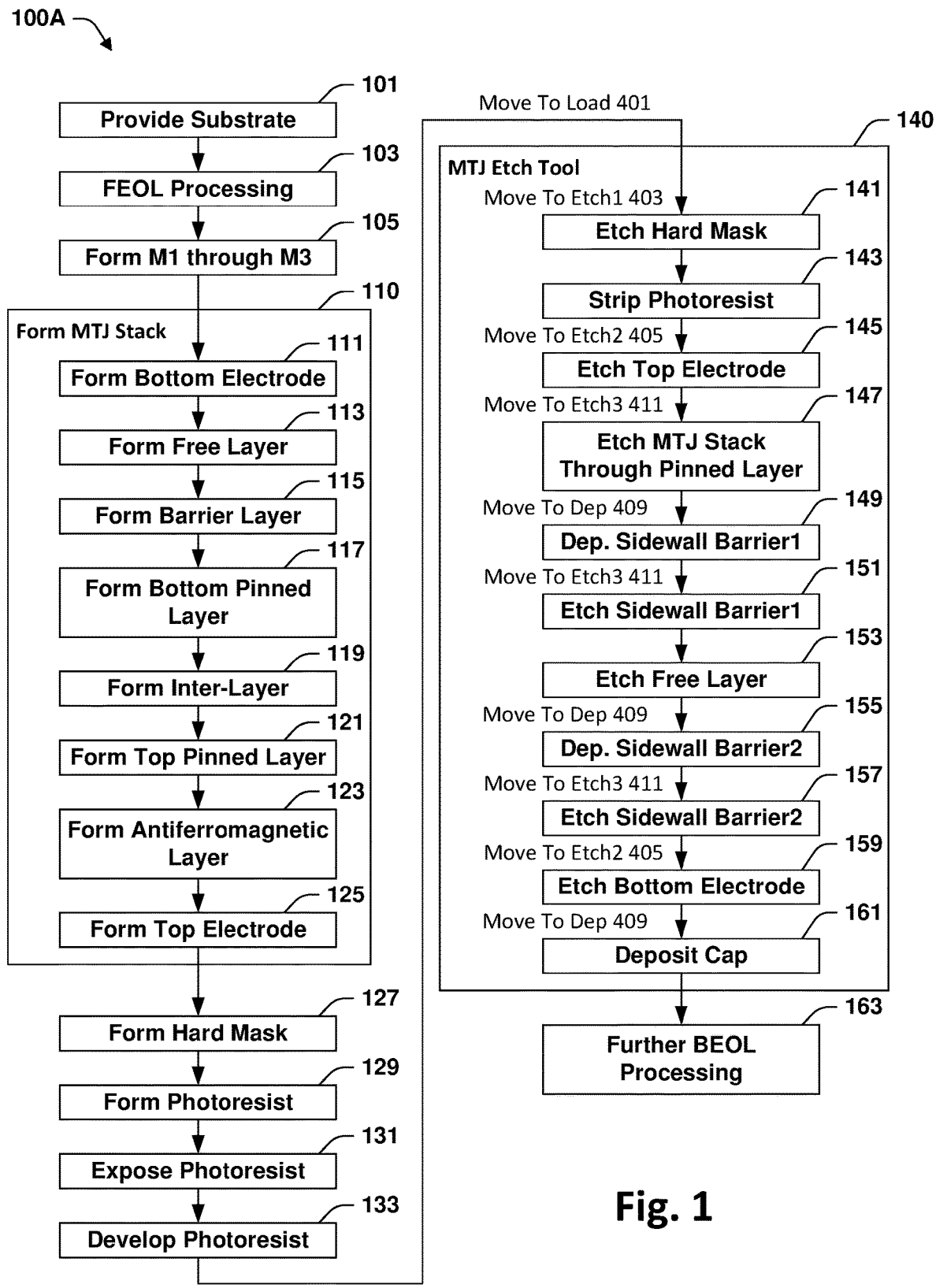
FIG. 1 provides a flow chart for a process according to one embodiment of the present disclosure.

FIG. 1 provides a flow chart for a process 100A, which is an example according to one embodiment of the present disclosure. FIGS. 2-9 illustrate an integrated circuit device 200A as it undergoes manufacturing by the method 100A. The integrated circuit device 200A is itself an example of another embodiment of the present disclosure.

Figure 15:
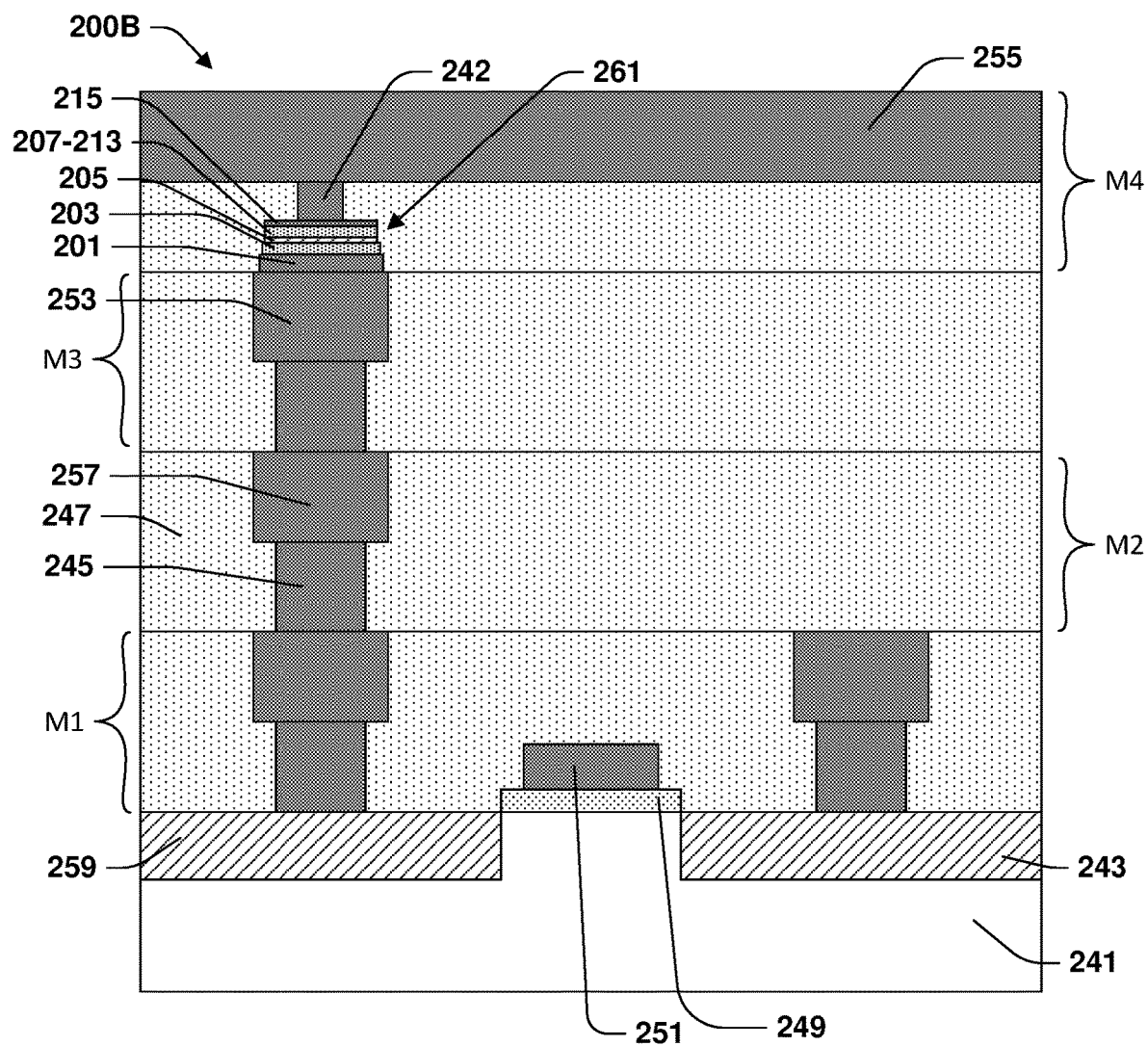
FIG. 15 provides a broader view of the integrated circuit device of FIGS. 11-13.

The process 100A begins with some routine acts: act 101, providing a semiconductor substrate 241, act 103, putting the semiconductor substrate 241 through front-end-of-line (FEOL) processing, and act 105, forming first, second, and third metal interconnect layers (M1, M2, and M3). In this example, an MTJ 261 is formed above the third metal interconnect layer M3 as shown in FIG. 15. This and other examples provided herein can be modified to form the MTJ 261 at any other desired location within an integrated circuit device. The semiconductor substrate 241 and interconnect layers M1, M2, and M3 are collectively represented by substrate 202 in FIGS. 2-9.

Figure 2:
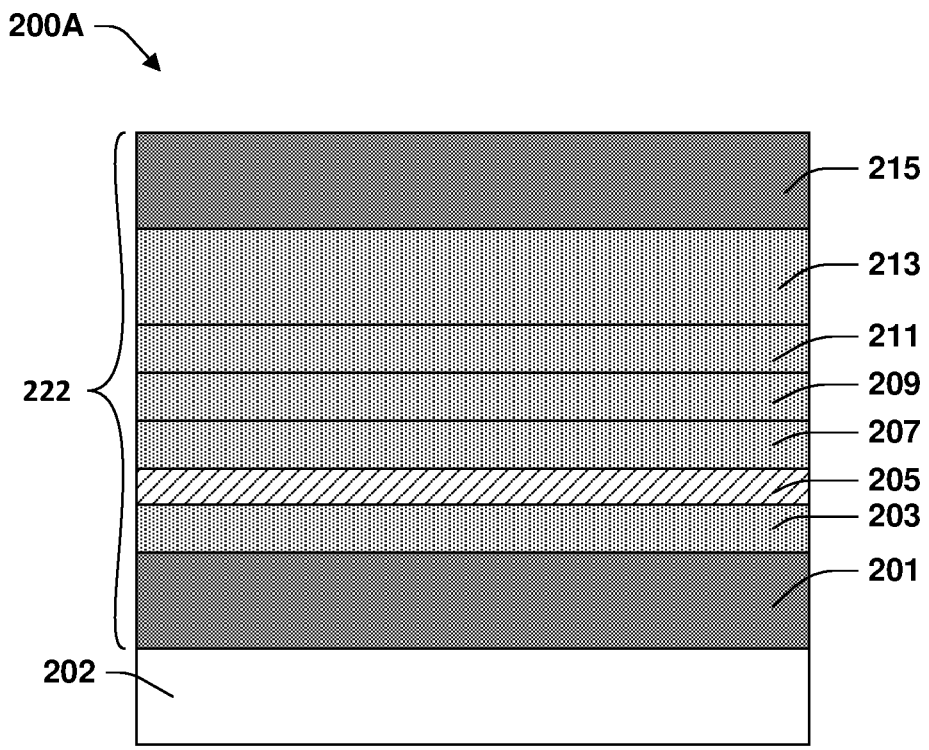
FIGS. 2-9 illustrate an integrated circuit device according to one embodiment of the present disclosure as it undergoes manufacturing by the process of FIG. 1.

The process 100A continues with a series of acts 110 that form a stack 222 for MTJs 261 over substrate 202 as shown in FIG. 2. The stack 222 includes a bottom electrode layer 201 formed by act 111, a free layer 203 formed by act 113, a barrier layer 205 formed by act 115, a bottom pinned layer 207 (or simply "the pinned layer 207") formed by act 117, an interlayer 209 formed by act 119, a top pinned layer 211 formed by act 121, an anti-ferromagnetic layer 213 formed by act 123, and a top electrode layer 215 formed by act 125.

Interlayer 209, top pinned layer 211, and anti-ferromagnetic layer 213 are all provided to keep fixed the magnetic orientation of bottom pinned layer 207. One or more of these layers can be omitted or replaced in any way that allows bottom layer 207 to remain a pinned layer. Bottom pinned layer 207 and top pinned layer 211 are aligned anti-parallel. Bottom pinned layer 207, interlayer 209, and top pinned layer 211 collectively provide a virtual anti-ferromagnetic structure. Bottom pinned layer 207 is what is generally referred to as "the pinned layer" of magnetic tunneling junction 261.

Figure 3:
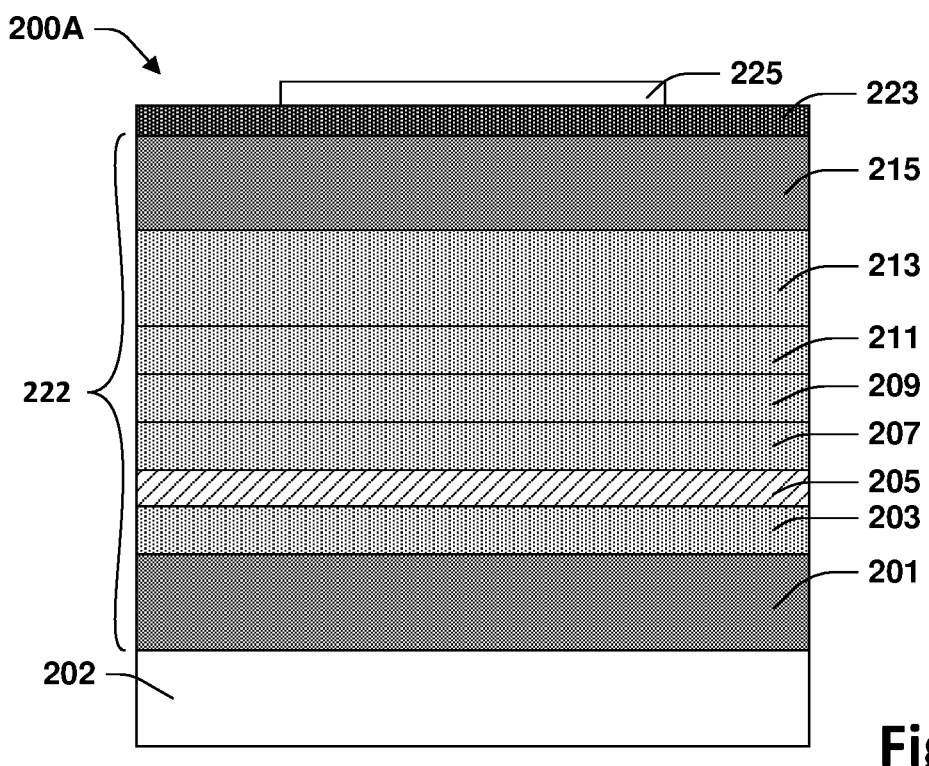

The process 100A continues with a series of acts that provide a mask for patterning MTJ stack 222. Act 127 is forming a hard mask layer 223. Act 129 is forming a photoresist 225. Act 131 is selectively exposing photoresist 225 according to the desired pattern for MTJs 261 formed out of MTJ stack 222. The pattern can form the MTJ stack 222 into an array of individual MRAM cells. Act 133 is developing photoresist 225 to provide a structure as shown in FIG. 3.

Figure 14:
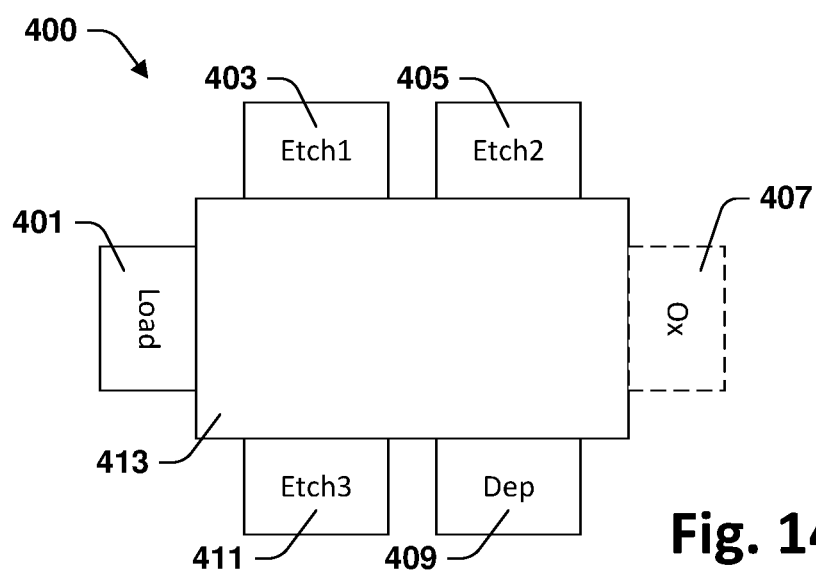
FIG. 14 is a schematic illustration of a tool in which portions of the processes of FIGS. 1 and 10 can be carried out.

Process 100A continues with a series of acts 140 that pattern and encapsulate MTJ stack 222. Encapsulation refers to forming a barrier around the edges or sides of MTJ stack 222 that are exposed by etching. In some embodiments, encapsulation takes place in situ, meaning within the same tool as the one in which MTJ stack 222 is etched. In situ encapsulation reduces the risk of contamination of MTJ stack 222 and especially of free layer 203. FIG. 14 provides a schematic illustration of a tool 400 within which acts 140 of the process 100A can all be completed. The tool 400 provides an example of a tool that enables in situ encapsulation.

The tool 400 includes interconnected chambers, each of which is configured to carry out certain types of processing. Wafer handling equipment within a central area 413 allows movement of wafers between the various chambers without exposing the wafers to the ambient environment of the plant in which the tool 400 is located. The tool 400 includes a chamber 401 configured to load wafers for processing, chambers 403, 405, and 411 each configured for a particular class of etch processes, and a chamber 409 for depositing encapsulating materials. FIG. 1 includes notations to illustrate an example flow of a wafer among the chambers of tool 400 as the wafer progresses through process 100A.

Figure 4:
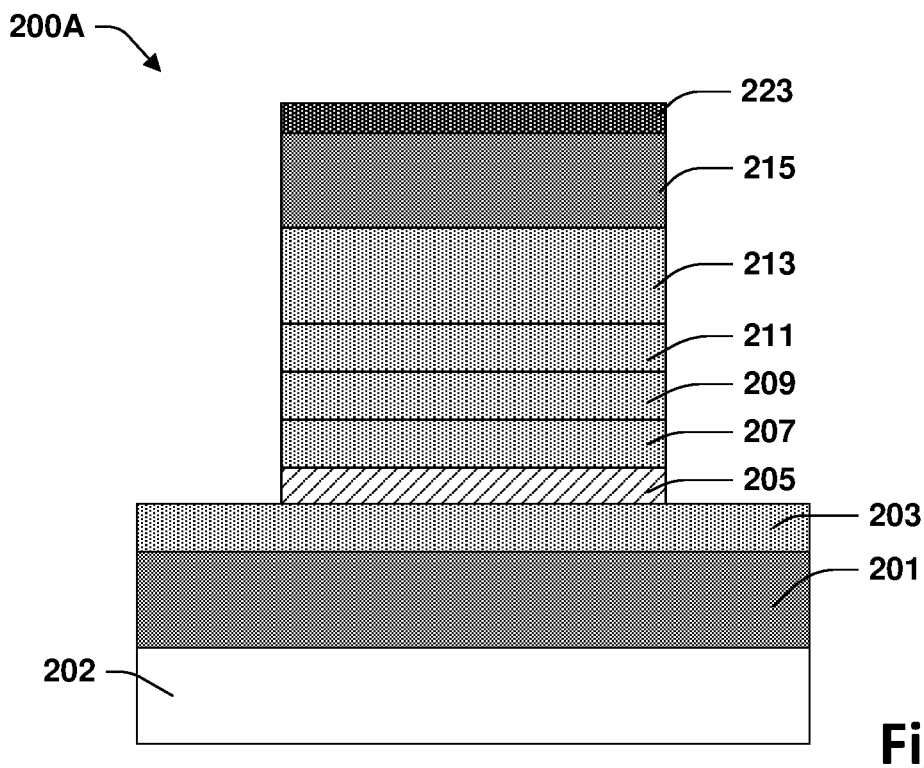

Processing within the tool 400 begins with a series of acts that etch MTJ stack 222 through bottom pinned layer 207 as shown in FIG. 4. These etches generally continue through barrier layer 205, whereby the free layer 203 provides an etch stop layer. The series of acts include act 141, etching the hard mask layer 223, act 143, stripping the photoresist 225, act 145, etching top electrode 215 and act 147, etching the rest of MTJ stack 222 through bottom pinned layer 207. The photoresist 225 can be removed at a different stage of processing from the one illustrated in FIG. 1. Stripping can be carried out simultaneously with one of the etch processes. Etching top electrode 215, anti-ferromagnetic layer 213, and bottom pinned layer 207 before exposing free layer 203 is enabled by the reverse MTJ stack 222 provided by the present disclosure and protects free layer 203 from plasma damage and contamination that could otherwise occur while etching these layers. In embodiments of the present disclosure, free layer 203 is bottom-most among these layers.

Figure 5:
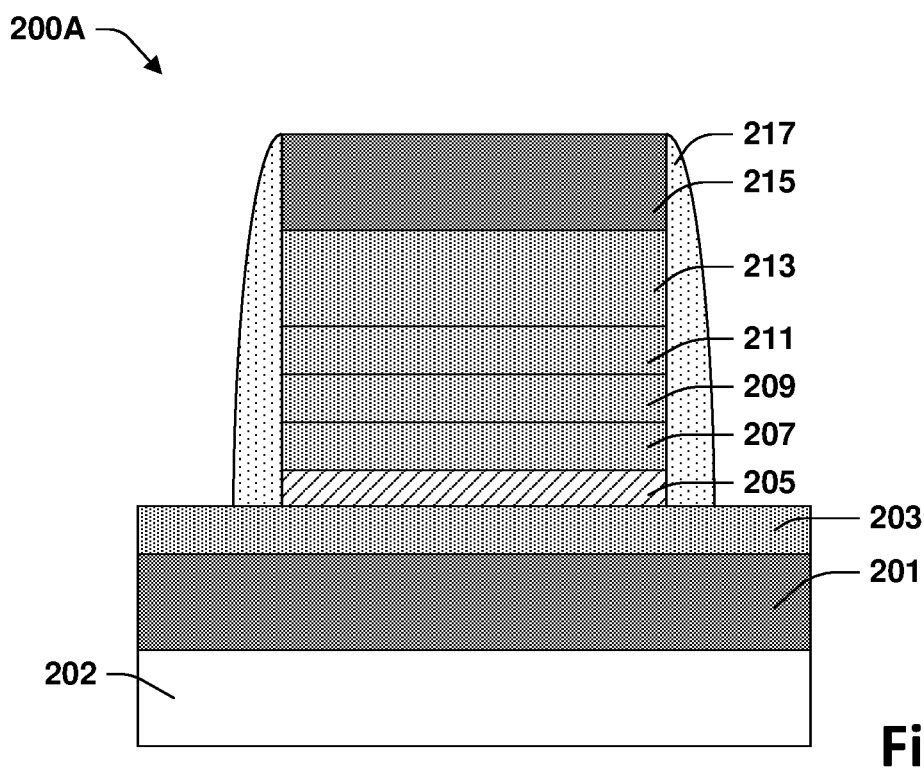

The process 100A continues with act 149, depositing a layer of sidewall barrier material and act 151, etching the sidewall barrier material to form the sidewall barrier material into spacers 217 as shown in FIG. 5. The hard mask layer 223 can be removed while etching the spacers 217 or can be allowed to remain through further processing. Spacers 217 are formed over free layer 203.

Figure 6:
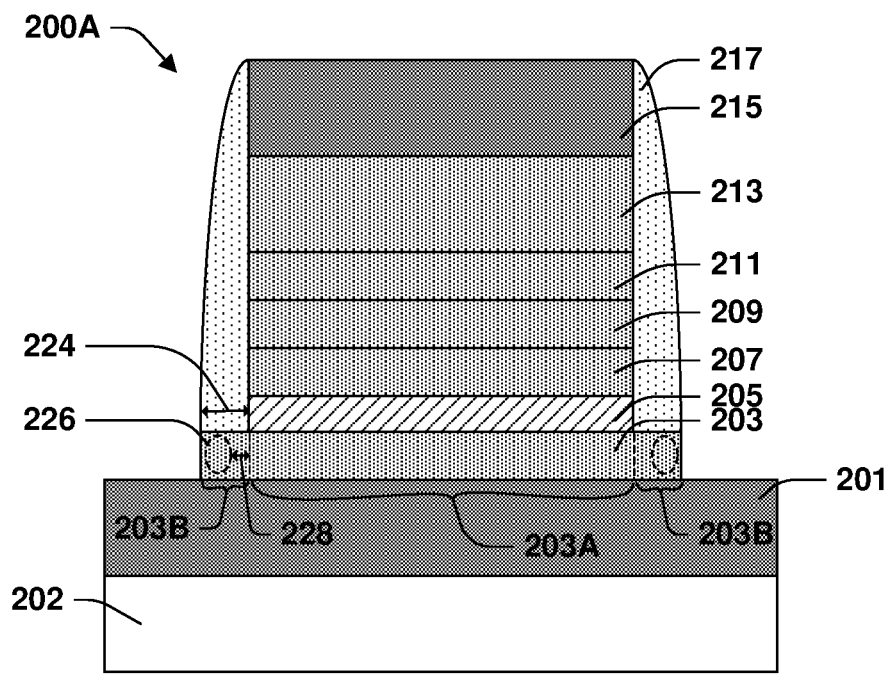

Act 153 etches through free layer 203 as shown in FIG. 6. For each MTJ 261, the free layer 203 includes a central region 203A and a perimeter region 203B. Plasma damage and contamination that occurs during etching can be restricted to the perimeter region 203B by selecting a suitable width 224 for spacers 217. Moreover, any damage or contamination of free layer 203 within the region 203B can be kept a distance 228 from the edge of bottom pinned layer 207. The distance 228 can be sufficiently great that there is no significant interaction between any damaged portions 226 of free layer 203 and bottom pinned layer 207. Spacers 217 are functional to protect those portions of free layer 203 that are sufficiently close to the pinned layer 207 for quantum mechanical tunneling between the two layers to occur at an appreciable rate.

Figure 7:
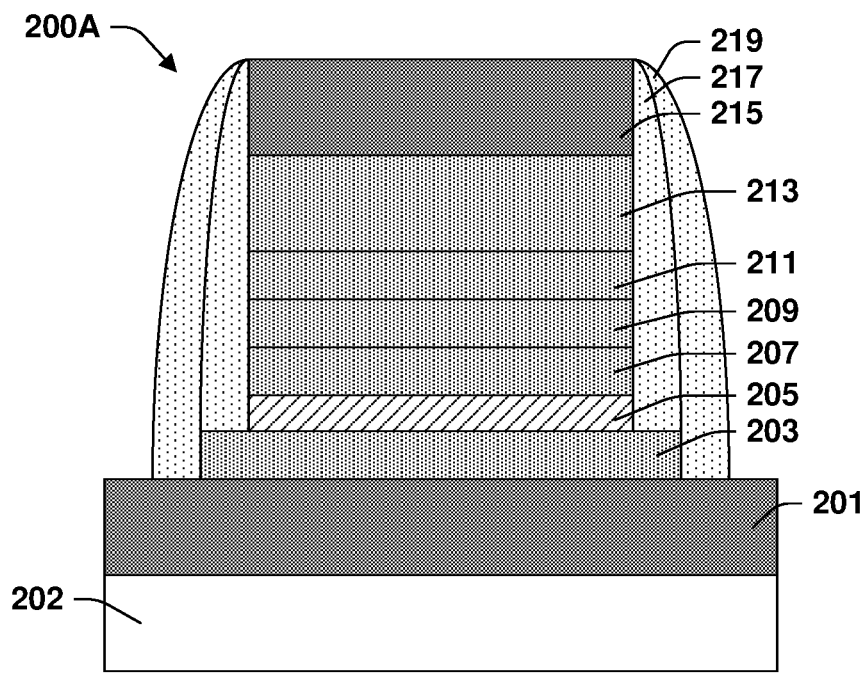

Act 155 is depositing another layer of sidewall barrier material. Act 157 is etching this layer of sidewall barrier material to form sidewall spacers 219, a second set of sidewall spacers, as shown in FIG. 7. In some embodiments, spacers 219 can be deposited immediately after free layer 203 is etched and before any other layers are etched to avoid contamination of free layer 203 that might occur while etching other layers. In some embodiments, sidewall spacers 219 are deposited in-situ with etching 153. Depositing sidewall spacers 219 in situ minimizes any contamination of free layer 203. Spacers 219 protect free layer 203 while bottom electrode 201 is etched. In some embodiments, the width 224 is sufficiently great that any damage or contamination at the edges of free layer 203 that might occur while etching bottom electrode 201 does not affect the functioning of MTJ 261. In those embodiments, spacers 219 are unnecessary acts and 155 and 157 can be skipped. Spacers 219 protect free layer 203 while bottom electrode 201 is being etched. In some embodiments, etching of bottom electrode 201 is delayed until a later stage of processing during which the sidewalls of free layer 203 are otherwise protected. Those are also embodiments in which spacers 219 are unnecessary acts and 155 and 157 can be skipped.

Figure 8:
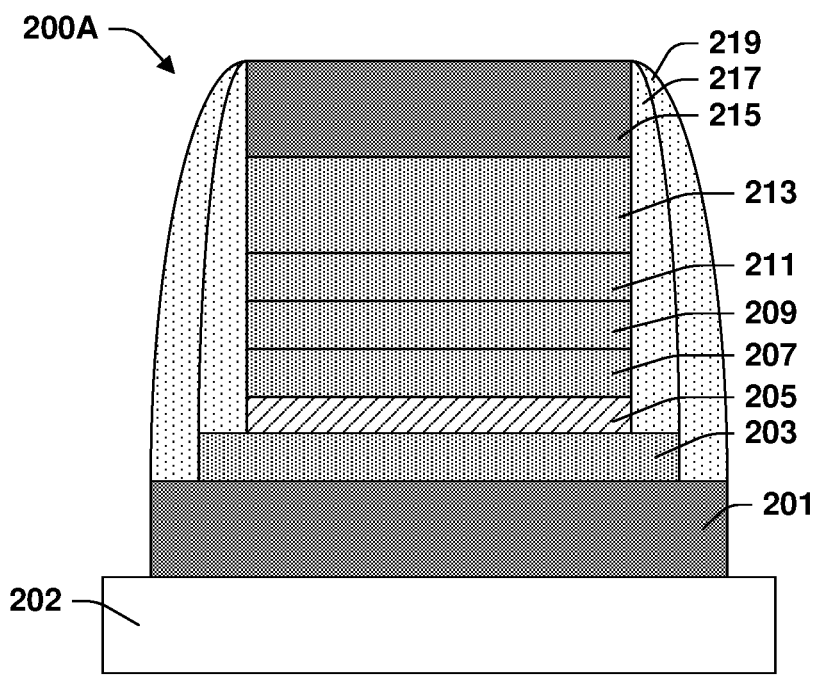
Figure 9:
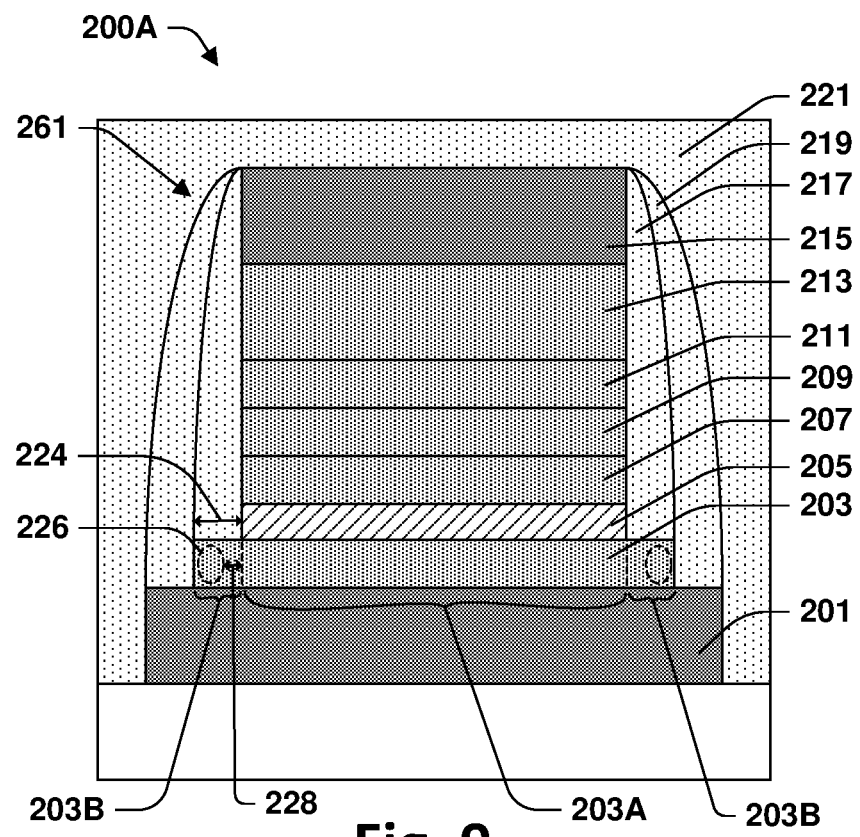

Act 159 is etching bottom electrode 201 as shown in FIG. 8. Act 161 forms a capping layer over MTJ 261 as shown in FIG. 9. Act 163 is further BEOL processing to complete formation of the device 200A. Due to spacers 219, bottom electrode 201 has a lager footprint than free layer 203. Due to sidewall spacers 217, free layer 203 has a larger footprint than bottom pinned layer 207.

Figure 10:
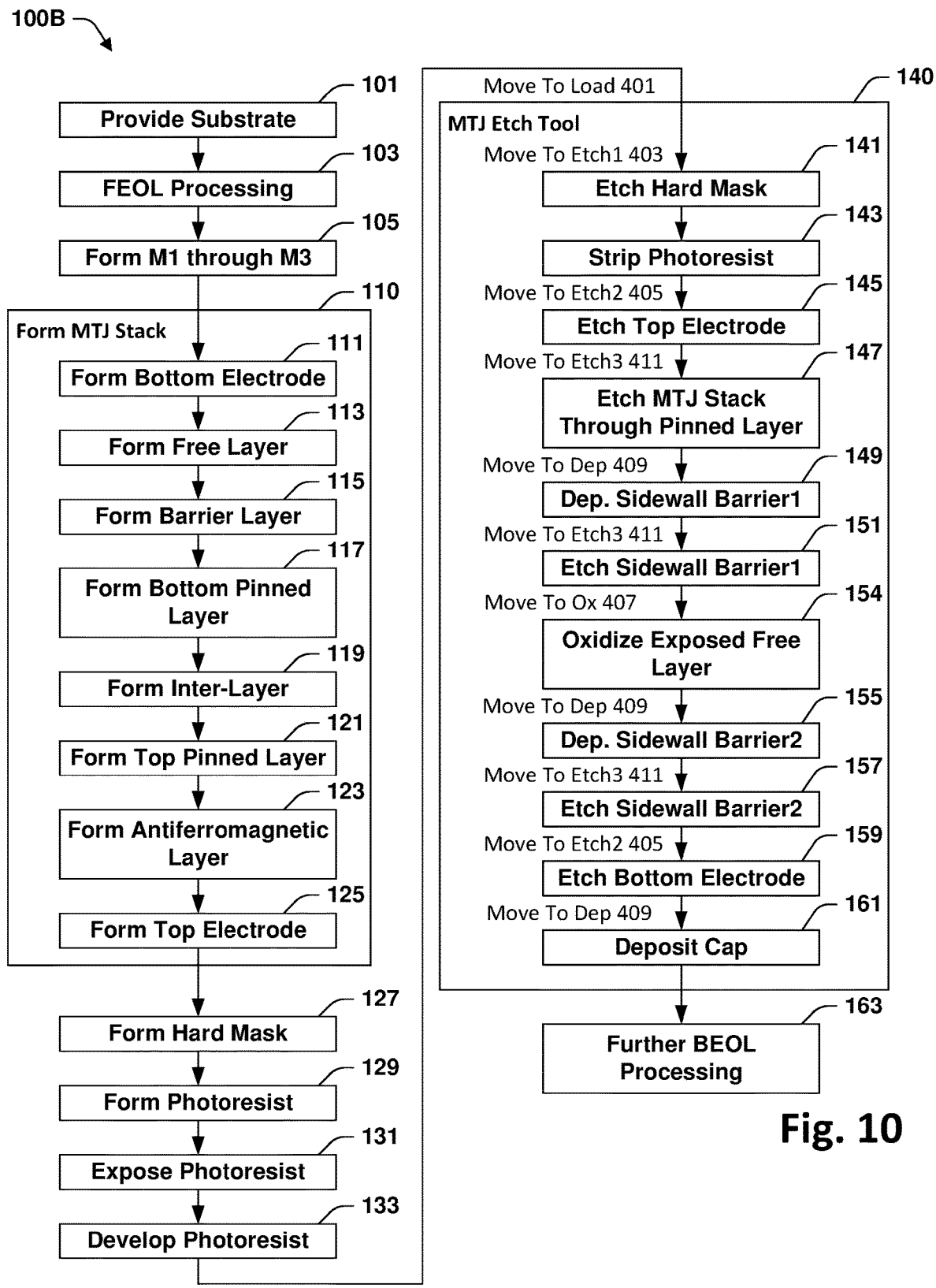
FIG. 10 provides a flow chart for a process according to another embodiment of the present disclosure.
Figure 11:
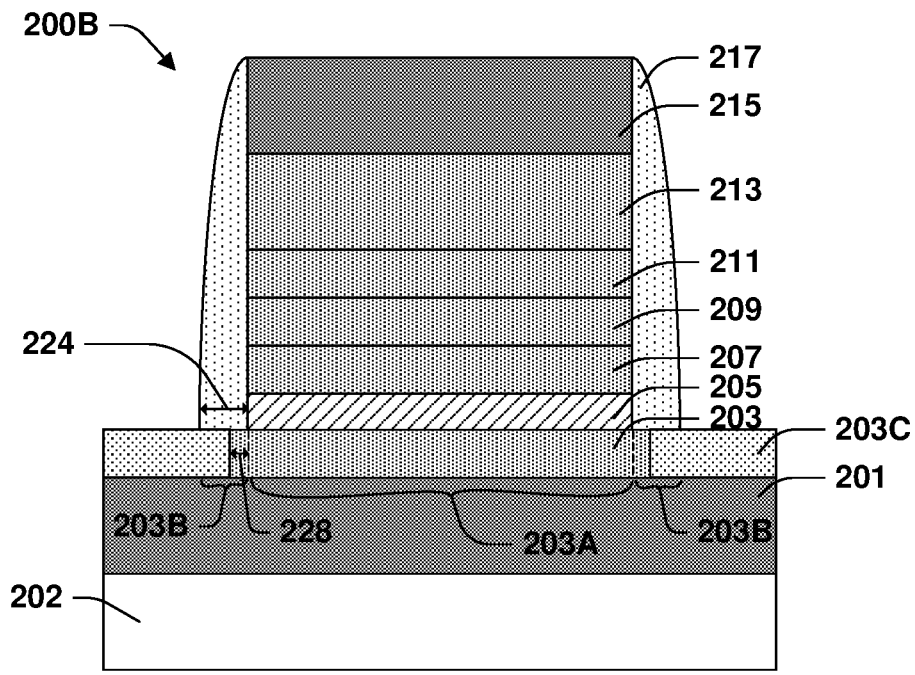
FIGS. 11-13 illustrate an integrated circuit device according to another embodiment of the present disclosure as it undergoes manufacturing by the process of FIG. 10.
Figure 12:
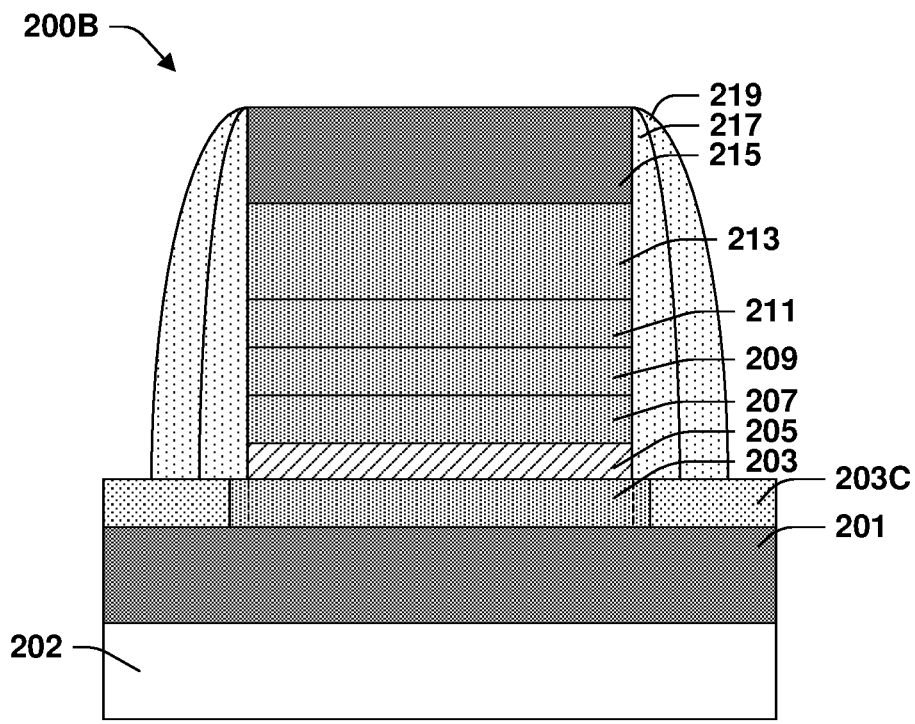
Figure 13:
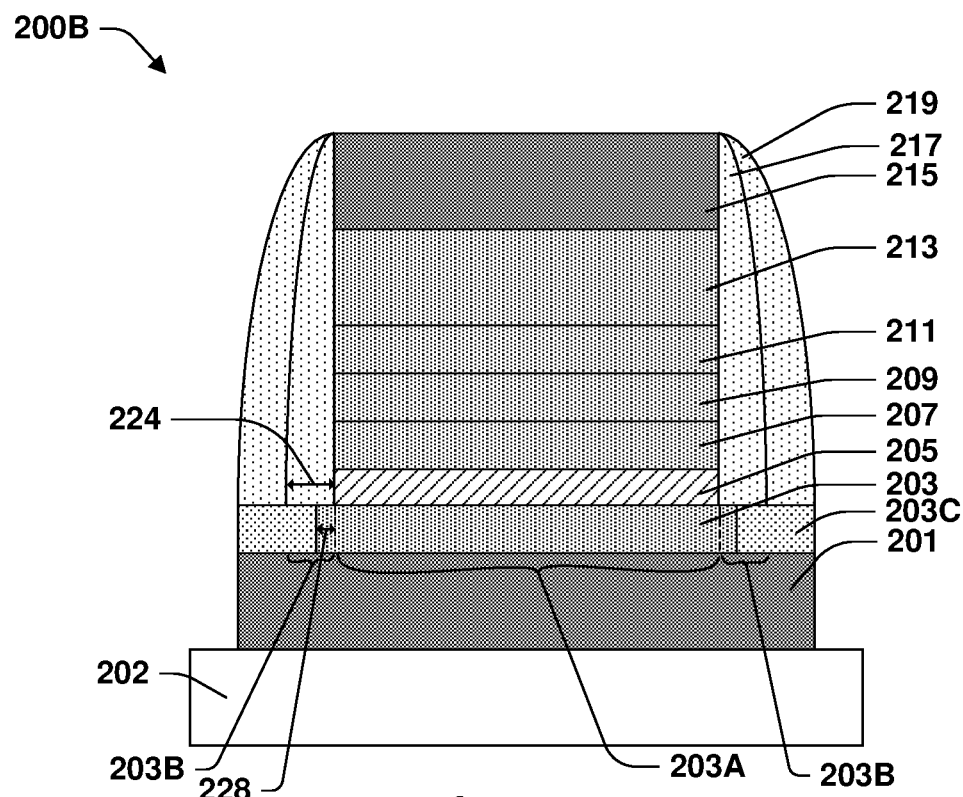

FIG. 10 provides a flow chart of a process 100B, which is an example according to another embodiment of the present disclosure. The description of process 100A generally applies to process 100B except that in process 100B instead of etching through the unmasked portion of free layer 203 with act 153, the unmasked portions are rendered non-conductive and non-magnetic by a chemical reaction, such as oxidation 154. FIGS. 11-13 illustrate an integrated circuit device 200B as it undergoes manufacturing by the method 100B. The description of integrated circuit device 200A generally applies to integrated circuit device 200B and vice versa except for differences that result from using oxidation 154 in place of etching 153.

FIG. 11 illustrates the integrated circuit device 200B after oxidation 154. Oxidation 154 renders a portion 203C of the free layer 203 to a non-conductive state. The oxidized portion 203C extends through the thickness of free layer 203 in the exposed areas and also somewhat into the portion 203B of the free layer 203 that is under spacer 217. By choosing a suitable width 224 for the spacer 217, the portion of the free layer 203C that is affected by oxidation 154 can be kept a distance 228 from the edge of bottom pinned layer 207. As in the device 200A, distance 228 can be made sufficiently great that there is no significant interaction between any damaged portions of free layer 203 and bottom pinned layer 207.

Process 100B continues like process 100A with act 155, depositing additional sidewall barrier material and act 157 etching this additional barrier material to form spacer 219 as shown in FIG. 12. Spacers 219 provide an additional layer of protection for the operative portion of free layer 203 when etching bottom electrode 201 by act 159 as shown in FIG. 13. Spacers 219 are optional in that they may not be required, particularly if the width 224 of spacers 217 is sufficiently great.

FIG. 15 shows additional structure of the device 200B, the additional structure also being generally applicable to the device 200A. As shown in FIG. 15, the substrate 202 includes a semiconductor body 241 in which is formed a transistor that includes drain region 259, source region 243, gate dielectric 249 and gate 251. Gate 251 is also a bit line for read operations in some embodiments. Vias 245 and metal structures 257 connect source region 243 to bottom electrode 201 through metal interconnect layers M1, M2, and M3. Metal line 253 within M3 provides a bit line for writing the MTJ 229 in cooperation with word line 255, which is formed in metallization layer M4. Via 242 connects top electrode layer 215 to word line 255.

In one embodiment, acts 140 of process 100B are carried out in situ. The tool 400 can be used for this purpose. An additional chamber 407 can be provided, if necessary, to carry out the oxidation process.

Figure 16:
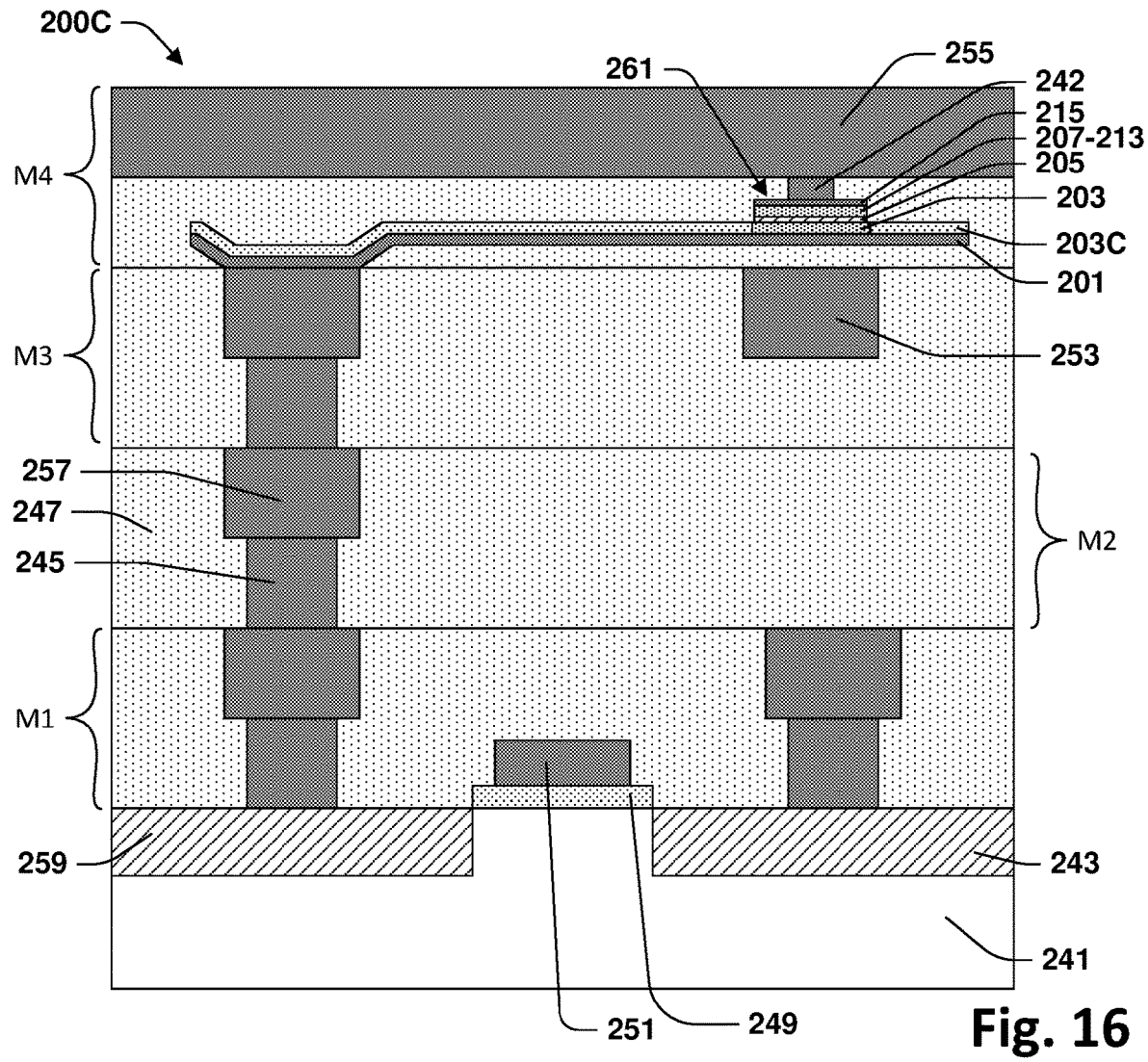
FIG. 16 illustrates an integrated circuit device according to another embodiment of the present disclosure.
Figure 17:
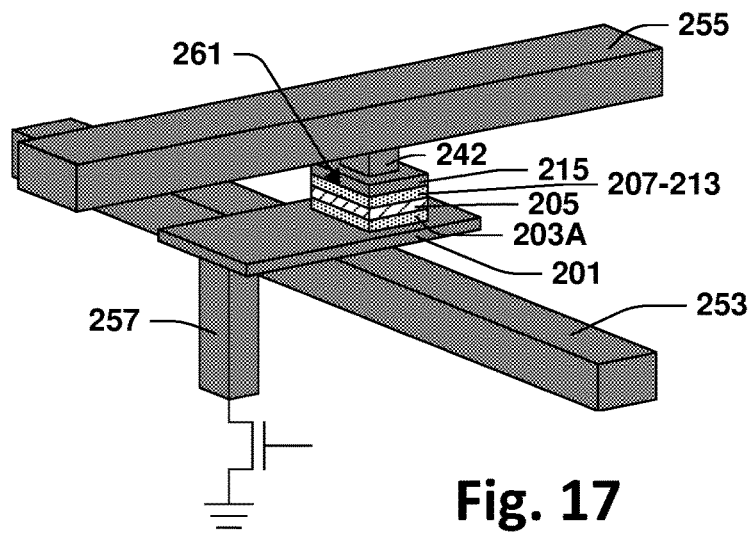
FIG. 17 provides a perspective view of the integrated circuit device of FIG. 16.

FIGS. 16 and 17 illustrate an integrated circuit device 200C according to another embodiment of the present disclosure. Device 200C is illustrative of embodiments in which free layer 203C is not cut off immediately adjacent MTJ 261 and in which spacers 219 are also unnecessary. The device 200C is similar to the device 200B of FIG. 15 except that whereas in the device 200B MTJ 261 is formed directly over word line 253 or, optionally, a via, in FIG. 16 the device 200C MTJ 261 is offset from the underlying metal structure. Forming MTJ 261 directly over a contact as in the device 200B has the advantage of providing the most compact structure. Forming MTJ 261 in an offset position as in the device 200C has the advantage that it provides a structure in which it is easier to form a planar surface over which to form MTJ 261.

One embodiment of the disclosure is an MTJ 261 including a free layer 203, a barrier layer 205 and a pinned layer 207 of which the free layer 203 is bottom-most, bottom-most meaning closest to the semiconductor body 241. In some embodiments, the MTJ 261 provides an MRAM cell. In some embodiments, there is an array of these cells, a bit line for the array are formed below the cells, and a word line for the array is formed above the cells.

The substrate 202 can be any suitable type of substrate. In some embodiments the substrate 202 includes a semiconductor body 241. Examples of semiconductor bodies include, without limitation, silicon, silicon on insulator (SOI), Ge, SiC, GaAs, GaAlAs, InP, GaN SiGe. The semiconductor of semiconductor body 241 can be in single crystal or polycrystalline form. Its composition can vary with location as in a continuously varying ratio of Si to Ge in a SiGe semiconductor. The semiconductor can have a multilayer structure. The semiconductor can be lightly doped.

Metal interconnect layers M1, M2, M3, and M4 include lines and vias of conductive material in a matrix of dielectric 247. The conductive material can by Ta, Cu, Al, or and othe suitable metal. The dielectric 247 can include one or more layers of any suitable dielectric(s). The dielectric can be $SiO_2$. In some embodiments, the dielectric 247 is a low-k dielectrics. A low-k dielectric is a material having a dielectric constant lower than that of silicon dioxide. Examples of low-k dielectrics include organosilicate glasses (OSG) such as carbon-doped silicon dioxide, fluorine-doped silicon dioxide (otherwise referred to as fluorinated silica glass (or FSG), and organic polymer low-k dielectrics. Examples of organic polymer low-k dielectrics include polyarylene ether, polyimide (PI), benzocyclbbutene, and amorphous polytetrafluoroethylene (PTFE). A low-k dielectric can be applied by any suitable means, including for example, spin coating or CVD.

Bottom electrode layer 201 and top electrode layer 215 can be any suitable conductive material. In some embodiments, these layers are formed from tantalum (Ta).

Free layer 203, bottom pined layer 207, and top pinned layer 211 can be any suitable ferromagnetic or other material that performs similarly to a ferromagnetic material. Materials that can be suitable include NiFe, CoFe, CoFeB. In some embodiments, free layer 203 is CoFeB. In some embodiments, bottom pined layer 207 and top pinned layer 211 are either CoFe or COFeB.

Interlayer 209 can be any suitable conductive material. In some embodiments, interlayer 207 is Ru.

Barrier layer 207 can be any suitable dielectric material. In some embodiments, barrier layer 207 is a metal oxide. In some embodiments, barrier layer 207 is MgO or an aluminum oxide such as $Al_2O_3$.

Anti-ferromagnetic layer 213 can be any suitable anti-ferromagnetic material. In some embodiments, the anti-ferromagnetic material is PtMn or IrMn.

Spacers 217, spacers 219, and capping layer 221 can be any suitable dielectrics materials. Dielectric materials that can be suitable for these layers include, for example, SiN, SiOx, and SiON. In some embodiments, spacers 217 are formed from one or more materials selected from the group consisting of SiN, SiOx, and SiON.

The present disclosure provides an integrated circuit device including a substrate and a magnetic tunneling junction (MTJ). The MTJ includes at least a pinned layer, a barrier layer, and a free layer. The MTJ is formed over a surface of the substrate. Of the pinned layer, the barrier layer, and the free layer, the free layer is closest to the surface.

The present disclosure provides a method of manufacturing an integrated circuit device. The method includes providing a substrate and forming a magnetic tunneling junction (MTJ) over the substrate. Forming the MTJ include forming a free layer, then a barrier layer; and then a pinned layer, whereby the fee layer is bottommost.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. An integrated circuit device, comprising:
a semiconductor substrate;
a magnetic tunneling junction (MTJ) formed over a surface of the semiconductor substrate, the MTJ comprising:

a bottom electrode disposed over the semiconductor substrate, the bottom electrode having outermost sidewalls spaced apart by a first distance;

a free layer arranged over the surface of the semiconductor substrate, the free layer configured to switch between at least two different magnetic orientations and having outermost sidewalls that are spaced apart by a second distance less than the first distance;

an insulating barrier layer arranged over the free layer and having outermost sidewalls spaced apart by a third distance less than the second distance; and a pinned layer arranged over the insulating barrier layer, the pinned layer having a fixed magnetic orientation.

2. The integrated circuit device of claim 1, wherein the outermost sidewalls of the insulating barrier layer are disposed on an upper surface of the free layer.

3. The integrated circuit device of claim 1, further comprising:

a first sidewall spacer structure over the free layer and having an inner sidewall that contacts an outer sidewall of the pinned layer.

4. The integrated circuit device of claim 3, further comprising:

a second sidewall spacer structure over the bottom electrode and having an inner sidewall that contacts an outer sidewall of the first sidewall spacer structure.

5. The integrated circuit device of claim 4, further comprising:

a low-k dielectric layer which contacts an outer sidewall of the second sidewall spacer structure and which extends down along the outermost sidewalls of the bottom electrode.

6. The integrated circuit device of claim 1, further comprising:

a sidewall spacer structure over the bottom electrode and having an inner sidewall that contacts an outer sidewall of the free layer.

7. An integrated circuit device, comprising:

a semiconductor substrate;

a bottom electrode disposed over the semiconductor substrate;

a first ferromagnetic layer arranged over the bottom electrode and having a width that is less than a width of the bottom electrode, such that a peripheral portion of an upper surface of the bottom electrode establishes a ledge extending from an outermost sidewall of the bottom electrode to an outermost sidewall of the first ferromagnetic layer; and a first sidewall spacer structure disposed on the ledge and having an inner sidewall that contacts an outer sidewall of the first ferromagnetic layer.

8. The integrated circuit device of claim 7, further comprising:

an insulating barrier layer arranged over the first ferromagnetic layer;

a second ferromagnetic layer over the insulating barrier layer; and wherein the insulating barrier layer and the second ferromagnetic layer have substantially aligned sidewalls which are disposed on an upper surface of the first ferromagnetic layer.

9. The integrated circuit device of claim 8, further comprising:

a second sidewall spacer structure over the first ferromagnetic layer and having an outer sidewall that contacts an inner sidewall of the first sidewall spacer structure.

10. The integrated circuit device of claim 9, wherein the second sidewall spacer structure has an inner sidewall that contacts the substantially aligned sidewalls of the insulating barrier layer and the second ferromagnetic layer.

11. The integrated circuit device of claim 8, wherein the first ferromagnetic layer is a free layer configured to switch between at least two different magnetic orientations, and the second ferromagnetic layer is a pinned layer having a fixed magnetic orientation.

12. The integrated circuit device of claim 8, wherein the substantially aligned sidewalls of the insulating barrier layer and the second ferromagnetic layer directly contact an upper surface of the first ferromagnetic layer.

13. An integrated circuit device, comprising:

a semiconductor substrate;

a bottom electrode disposed over the semiconductor substrate, the bottom electrode having outermost sidewalls spaced apart by a first distance;

a first ferromagnetic layer arranged over the semiconductor substrate, the first ferromagnetic layer having outermost sidewalls spaced apart by a second distance that is less than the first distance by a first difference; and a first sidewall spacer structure disposed on the bottom electrode, the first sidewall spacer structure having a lowermost portion with a lateral thickness approximately equal to the first difference and having an inner sidewall that contacts an outer sidewall of the first ferromagnetic layer.

14. The integrated circuit device of claim 13, further comprising;

an insulating barrier layer arranged over the first ferromagnetic layer;

a second ferromagnetic layer arranged over the insulating barrier layer;

a top electrode arranged over the second ferromagnetic layer, where an outer sidewall of the top electrode is substantially aligned with an outer sidewall of the second ferromagnetic layer.

15. The integrated circuit device of claim 14, further comprising:

a second sidewall spacer structure arranged over the first ferromagnetic layer and having an outer sidewall that contacts the inner sidewall of the first sidewall spacer structure.

16. The integrated circuit device of claim 15, wherein the second sidewall spacer structure has a bottom surface disposed on an upper surface of the first ferromagnetic layer.

17. The integrated circuit device of claim 14, wherein the first ferromagnetic layer is a free layer configured to switch between at least two different magnetic orientations, and the second ferromagnetic layer is a pinned layer configured to have a fixed magnetic orientation.

18. The integrated circuit device of claim 17:

wherein outermost sidewalls of the insulating barrier layer are spaced apart by a third distance, the third distance being less than the second distance.

19. The integrated circuit device of claim 14, wherein the insulating barrier layer and the top electrode have substantially aligned sidewalls that are disposed over an upper surface of the first ferromagnetic layer.

20. The integrated circuit device of claim 14, wherein the second ferromagnetic layer and the top electrode have substantially aligned sidewalls that are disposed over an upper surface of the first ferromagnetic layer.

* * * * *